United States Patent
Okuyama et al.

(10) Patent No.: US 9,746,772 B2
(45) Date of Patent: Aug. 29, 2017

(54) RESIST UNDERLAYER FILM FORMING COMPOSITION FOR LITHOGRAPHY CONTAINING POLYETHER STRUCTURE-CONTAINING RESIN

(71) Applicant: NISSAN CHEMICAL INDUSTRIES, LTD., Tokyo (JP)

(72) Inventors: Hiroaki Okuyama, Toyama (JP); Yasunobu Someya, Toyama (JP); Masakazu Kato, Toyama (JP); Tetsuya Shinjo, Toyama (JP); Keisuke Hashimoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/205,165

(22) Filed: Jul. 8, 2016

(65) Prior Publication Data

US 2016/0320704 A1    Nov. 3, 2016

Related U.S. Application Data

(62) Division of application No. 13/825,925, filed as application No. PCT/JP2011/073233 on Oct. 7, 2011, now abandoned.

(30) Foreign Application Priority Data

Oct. 14, 2010    (JP) ............................ 2010-231217

(51) Int. Cl.
| | |
|---|---|
| *G03F 7/11* | (2006.01) |
| *G03F 7/32* | (2006.01) |
| *G03F 7/20* | (2006.01) |
| *G03F 7/09* | (2006.01) |
| *H01L 21/308* | (2006.01) |
| *C08G 65/40* | (2006.01) |
| *C08L 71/00* | (2006.01) |
| *C09D 171/00* | (2006.01) |

(52) U.S. Cl.
CPC ............ *G03F 7/11* (2013.01); *C08G 65/4006* (2013.01); *C08G 65/4012* (2013.01); *C08L 71/00* (2013.01); *C09D 171/00* (2013.01); *G03F 7/091* (2013.01); *G03F 7/094* (2013.01); *G03F 7/2059* (2013.01); *G03F 7/32* (2013.01); *H01L 21/308* (2013.01); *H01L 21/3086* (2013.01); *C08G 2650/40* (2013.01); *Y10T 428/31942* (2015.04)

(58) Field of Classification Search
CPC .......... H01L 21/308; G03F 7/091; G03F 7/094
See application file for complete search history.

(56) References Cited

U.S. PATENT DOCUMENTS

| | | | |
|---|---|---|---|
| 4,766,197 A | 8/1988 | Clendinning et al. | |
| 4,803,258 A | 2/1989 | Yamaguchi et al. | |
| 5,268,444 A | 12/1993 | Jensen et al. | |
| 5,607,824 A | 3/1997 | Fahey et al. | |
| 5,814,426 A | 9/1998 | Fuller et al. | |
| 5,863,963 A | 1/1999 | Narang et al. | |
| 5,994,425 A | 11/1999 | Narang et al. | |
| 2003/0038109 A1* | 2/2003 | Dokumaci | ........ H01L 21/76819 216/38 |
| 2006/0111547 A1 | 5/2006 | Hata et al. | |
| 2009/0162795 A1* | 6/2009 | Lee | ........................ H01L 21/308 430/319 |
| 2011/0027722 A1 | 2/2011 | Cho et al. | |

FOREIGN PATENT DOCUMENTS

| | | |
|---|---|---|
| GB | 2 197 333 A | 5/1988 |
| JP | 2006-152295 A | 6/2006 |
| JP | 2006-285046 A | 10/2006 |
| JP | 2008-015223 A | 1/2008 |
| JP | 2011-032475 A | 2/2011 |
| WO | 2010/041626 A1 | 4/2010 |

OTHER PUBLICATIONS

Delfort et al., Ethynyl-Terminated Polyethers from New End-Capping Agents: Synthesis and Characterization, Journal of Polymer Science: Part A Polymer Chemistry, vol. 28, pp. 2451-2464, 1990.
Dec. 20, 2011 Written Opinion issued in International Application No. PCT/JP2011/073233.
Dec. 20, 2011 International Search Report issued in International Application No. PCT/JP2011/073233.

* cited by examiner

*Primary Examiner* — Cynthia Hamilton
(74) *Attorney, Agent, or Firm* — Oliff PLC

(57) ABSTRACT

A method for producing a semiconductor device, which includes forming an underlayer film on a semiconductor substrate with a resist underlayer film forming composition that contains a solvent, and a polymer containing a unit structure of Formula (2):

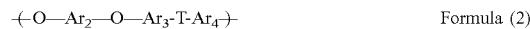

Formula (2)

where $Ar_2$, $Ar_3$, and $Ar_4$ are individually a $C_{6-50}$ arylene group or an organic group containing a heterocyclic group; at least one of $Ar_3$ and $Ar_4$ is a phenylene group; and T is a carbonyl group. The resist underlayer film forming composition has a solid content of 0.1 to 70 mass % of a total mass of the composition.

9 Claims, No Drawings

RESIST UNDERLAYER FILM FORMING COMPOSITION FOR LITHOGRAPHY CONTAINING POLYETHER STRUCTURE-CONTAINING RESIN

This is a divisional of application Ser. No. 13/825,925 filed Apr. 10, 2013, which is a National Stage application of PCT/JP2011/073233 filed Oct. 7, 2011, and claims the benefit of Japanese Application No. 2010-231217 filed Oct. 14, 2010. The entire disclosures of the prior applications are hereby incorporated by reference herein in their entirety.

I. TECHNICAL FIELD

The present invention relates to a resist underlayer film forming composition for lithography that is effectively used for processing of a semiconductor substrate, a resist pattern forming method employing the resist underlayer film forming composition, and a method for producing a semiconductor device.

BACKGROUND ART

Conventionally, in the production of semiconductor devices, fine processing by lithography using a photoresist composition has been performed. The fine processing is a processing method including: forming a thin film of a photoresist composition on a substrate to be processed such as a silicon wafer; irradiating the resultant thin film with an active ray such as an ultraviolet ray through a mask pattern in which a pattern of a semiconductor device is depicted for development; and etching the substrate to be processed such as a silicon wafer using the resultant photoresist pattern as a protecting film. Recently, however, the high integration of semiconductor devices has progressed and the adopted active ray tends to have a shorter wavelength, such as an ArF excimer laser (193 nm) replacing a KrF excimer laser (248 nm). Following such a tendency, the influence of diffused reflection of an active ray on a substrate or a standing wave has become a large problem. To address this, what has been widely studied is the use of an anti-reflective coating (Bottom Anti-Reflective Coating, BARC) between the photoresist and the substrate to be processed.

Progress in refinement of the resist pattern will cause a problem of the resolution or collapse of a resist pattern after development; therefore, thinning of the resist will be required. In this sense, it is difficult to secure a resist pattern film thickness sufficient for processing the substrate, which requires a process for imparting a function as a mask for processing the substrate not only to the resist pattern, but also to the resist underlayer film provided between the resist and the semiconductor substrate to be processed. As a resist underlayer film for such a process, there have started to be required a resist underlayer film for lithography having a selection ratio of a dry etching rate close to that of the resist, a resist underlayer film for lithography having a selection ratio of a dry etching rate smaller than that of the resist, and a resist underlayer film for lithography having a selection ratio of a dry etching rate smaller than that of the semiconductor substrate, as a resist underlayer film, unlike a conventional resist underlayer film having high etching rate property (high etching rate).

In addition, a heat resistant resist underlayer film having a fluorene structure is disclosed (Patent Document 1).

PRIOR-ART DOCUMENT

Patent Document

Patent Document 1: International Publication No. WO 2010/041626 pamphlet

II. SUMMARY OF THE INVENTION

Problem to be Solved by the Invention

The present invention provides a resist underlayer film forming composition for using for a lithography process of the production of semiconductor devices. It is an object of the present invention to provide a resist underlayer film for lithography causing no intermixing with a resist layer, providing an excellent resist pattern, and having: a selection ratio of a dry etching rate close to that of the resist; a selection ratio of a dry etching rate smaller than that of the resist; or a selection ratio of a dry etching rate smaller than that of the semiconductor substrate. The present invention also provides a resist underlayer film for lithography capable of imparting performance of effectively absorbing light reflected on the substrate when irradiated light having a wavelength of 248 nm, 193 nm, 157 nm, or the like is used for fine processing. Furthermore, it is an object of the present invention to provide a resist pattern forming method using the resist underlayer film forming composition. Then, the present invention provides a resist underlayer film forming composition for forming a resist underlayer film providing heat resistance in combination with other advantageous properties.

Means for Solving the Problem

The present invention is, according to a first aspect, a resist underlayer film forming composition for lithography, containing a polymer containing a unit structure of Formula (1):

Formula (1)

(in Formula (1), $Ar_1$ is a $C_{6-50}$ arylene group or an organic group containing a heterocyclic group), a unit structure of Formula (2):

Formula (2)

(in Formula (2), $Ar_2$, $Ar_3$, and $Ar_4$ are individually a $C_{6-50}$ arylene group or an organic group containing a heterocyclic group; and T is a carbonyl group or a sulfonyl group), or a combination of the unit structure of Formula (1) and the unit structure of Formula (2), according to a second aspect, the resist underlayer film forming composition according to the first aspect, in which the resist underlayer film forming composition for lithography contains a polymer containing the unit structure of Formula (1), and the organic group of $Ar_1$ is an organic group containing a fluorene structure, according to a third aspect, the resist underlayer film forming composition according to the first aspect, in which the resist underlayer film forming composition for lithography contains a polymer containing the unit structure of Formula (2), and the organic group of $Ar_2$ is an organic group containing a fluorene structure, according to a fourth aspect, the resist underlayer film forming composition according to the first aspect, in which the resist underlayer film forming composition for lithography contains a polymer containing a combination of the unit structure of Formula (1) and the unit structure of Formula (2), and at least one of the organic group of $Ar_1$ and the organic group of $Ar_2$ is an organic group containing a fluorene structure, according to a fifth aspect, the resist underlayer film forming composition according to the first aspect, in which the resist underlayer film forming composition for lithography contains a polymer containing the unit structure of Formula (1), and the organic group of $Ar_1$ is an organic group containing a combination of an arylene group with a group containing a carbon-carbon triple bond and/or a group containing a carbon-carbon double bond, according to a sixth aspect, the resist underlayer film forming composition according to the first aspect, in which the resist underlayer film forming composition for lithography contains a polymer containing the unit structure of Formula (2), and the organic group of $Ar_2$ is an organic group containing a combination of an arylene group with a group containing a carbon-carbon triple bond and/or a group containing a carbon-carbon double bond, according to a seventh aspect, the resist underlayer film forming composition according to the first aspect, in which the resist underlayer film forming composition for lithography contains a polymer containing a combination of the unit structure of Formula (1) and the unit structure of Formula (2), and at least one of the organic group of $Ar_1$ and the organic group of $Ar_2$ is an organic group containing a combination of an arylene group with a group containing a carbon-carbon triple bond and/or a group containing a carbon-carbon double bond, according to an eighth aspect, the resist underlayer film forming composition according to the first aspect, in which the resist underlayer film forming composition for lithography contains a polymer containing the unit structure of Formula (1), and the organic group of $Ar_1$ is an organic group containing a biphenylene structure, according to a ninth aspect, the resist underlayer film forming composition according to the first aspect, in which the resist underlayer film forming composition for lithography contains a polymer containing the unit structure of Formula (2), and the organic group of $Ar_2$ is an organic group containing a biphenylene structure, according to a tenth aspect, the resist underlayer film forming composition according to the first aspect, in which the resist underlayer film forming composition for lithography contains a polymer containing a combination of the unit structure of Formula (1) and the unit structure of Formula (2), and at least one of the organic group of $Ar_1$ and the organic group of $Ar_2$ is an organic group containing a biphenylene structure, according to an eleventh aspect, the resist underlayer film forming composition according to the first aspect, in which the resist underlayer film forming composition for lithography contains a polymer containing the unit structure of Formula (2), and at least one of the organic group of $Ar_3$ and the organic group of $Ar_4$ is a phenylene group, according to a twelfth aspect, the resist underlayer film forming composition according to the first aspect, in which the resist underlayer film forming composition for lithography contains a polymer containing a combination of the unit structure of Formula (1) and the unit structure of Formula (2), and at least one of the organic group of $Ar_3$ and the organic group of $Ar_4$ is a phenylene group, according to a thirteenth aspect, the resist underlayer film forming composition according to any one of the first aspect to the twelfth aspect further containing an acid or an acid generator, according to a fourteenth aspect, a resist underlayer film obtained by applying the resist underlayer film forming composition described in any one of the first aspect to the thirteenth aspect onto a semiconductor substrate and baking the resultant film, according to a fifteenth aspect, a method for producing a semiconductor device including: a process of forming an underlayer film with the resist underlayer film forming composition described in any one of the first aspect to the thirteenth aspect on a semiconductor substrate; a process of forming a resist film on the underlayer film; a process of irradiating the resist film with light or an electron beam and developing the resist film so as to form a resist pattern; a process of etching the underlayer film according to the resist pattern of the resist film; and a process of processing the semiconductor substrate according to the patterned underlayer film, and according to a sixteenth aspect, a method for producing a semiconductor device including: a process of forming an underlayer film with the resist underlayer film forming composition described in any one of the first aspect to the thirteenth aspect on a semiconductor substrate; a process of forming a hardmask on the underlayer film; a process of further forming a resist film on the hardmask; a process of irradiating the resist film with light or an electron beam and developing the resist film so as to form a resist pattern; a process of etching the hardmask according to the resist pattern of the resist film; a process of etching the underlayer film according to the patterned hardmask; and a process of processing the semiconductor substrate according to the patterned underlayer film.

Effect of the Invention

With the resist underlayer film forming composition of the present invention, an advantageous pattern shape of a resist can be formed without causing intermixing with an upper layer of the resist underlayer film.

The resist underlayer film forming composition of the present invention can have performance of effectively suppressing reflection on the substrate and provide an effect as an anti-reflective coating for exposure light in combination with other advantageous properties.

The resist underlayer film forming composition of the present invention can provide an excellent resist underlayer film having a selection ratio of a dry etching rate close to that of the resist, a selection ratio of a dry etching rate smaller than that of the resist, or a selection ratio of a dry etching rate smaller than that of the semiconductor substrate.

Due to refinement of the resist pattern, for preventing the resist pattern from collapsing after development, thinning of the resist is performed. For such a thin film resist, there is a process including: transferring a resist pattern to an underlayer film thereof by etching process; and processing the substrate using the underlayer film as a mask. There is another process in which a process including transferring a resist pattern to an underlayer film thereof by etching process and further transferring the pattern transferred to the underlayer film to an underlayer film thereof using a gas having a different gas composition is repeatedly performed so that the substrate is processed. The resist underlayer film and the forming composition thereof of the present invention are effective for these processes and when the substrate is processed using the resist underlayer film of the present invention, the resist underlayer film has satisfactory etching resistance relative to the substrate to be processed (for example, a thermally oxidized silicon film, a nitride silicon film, a polysilicon film, and the like on the substrate).

The resist underlayer film of the present invention can be used as a planarization film, a resist underlayer film, a contamination preventing film for the resist layer, and a film having dry etching selectivity. Use of the resist underlayer film of the present invention makes it possible to easily and accurately perform the formation of a resist pattern in a lithography process of the semiconductor production.

There is a process including: forming a resist underlayer film with a resist underlayer film forming composition on a substrate; forming a hardmask on the resist underlayer film; forming a resist film on the hardmask; forming a resist pattern by exposure and development; transferring the resist pattern to the hardmask; transferring the resist pattern transferred to the hardmask to the resist underlayer film; and processing the semiconductor substrate according to the resist underlayer film. In this process, there are a case where the formation of the hardmask is performed by a coating-type composition containing an organic polymer or an inorganic polymer and a solvent, and a case where the formation of the hardmask is performed by vacuum deposition of an inorganic substance. In vacuum deposition of an inorganic substance (for example, silicon nitride oxide), a deposited substance is deposited on the surface of the resist underlayer film and at this time, the temperature of the surface of the resist underlayer film is elevated to around 400° C. In the resist underlayer film forming composition of the present invention, the used polymer is a copolymer containing a polyether structure, for example, a unit structure of fluorene naphthol and a unit structure of arylene alkylene, so that the used polymer has extremely high heat resistance and is difficult to cause thermal degradation even by the deposition of the deposited substance.

BEST MODES FOR CARRYING OUT THE INVENTION

The present invention is a resist underlayer film forming composition for lithography containing a polymer containing a unit structure of Formula (1), a unit structure of Formula (2), or a unit structure containing a combination of these unit structures.

The resist underlayer film forming composition may contain a crosslinking agent, an acid, and if necessary, an additive such as an acid generator and a surfactant. The solid content of the composition is 0.1 to 70% by mass or 0.1 to 60% by mass. The solid content is a content of a component remaining after a solvent is removed from the resist underlayer film forming composition.

In the solid content, the above polymer can be contained in a content of 1 to 100% by mass, 1 to 99% by mass, or 50 to 99% by mass.

The polymer used in the present invention has a weight average molecular weight of 600 to 1,000,000, preferably 1,000 to 200,000.

The unit structure of Formula (1) is a unit structure having a polyether structure and the unit structure of Formula (2) is a unit structure having a polyetheretherketone structure or a polyetheretherslfon structure.

In the unit structure of Formula (1), $Ar_1$ is a $C_{6-50}$ arylene group or an organic group containing a heterocyclic group. The organic group is, for example, a divalent to tetravalent group. In Formula (2), $Ar_2$, $Ar_3$, and $Ar_4$ are individually a $C_{6-50}$ arylene group or an organic group containing a heterocyclic group, and T is a carbonyl group or a sulfonyl group. Arylene groups or heterocyclic groups in the organic groups of $Ar_1$ to $Ar_4$ can be used individually or in combination of two or more of them. The arylene group and the heterocyclic group are, for example, a divalent to tetravalent group.

The $C_{6-50}$ arylene group is a divalent organic group corresponding to an aryl group and examples thereof include divalent groups corresponding to a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a fluorene group, a fluorene derivative group, a pyrene group, and a pentacene group.

Examples of the heterocyclic group include organic groups corresponding to heterocyclic rings such as pyrrole, thiophene, furan, imidazole, triazole, oxazole, thiazole, pyrazole, isoxazole, isothiazole, pyridine, pyridazine, pyrimidine, pyrazine, piperidine, piperazine, morpholine, pyran, and carbazole.

The organic group containing a $C_{6-50}$ arylene group can be used as the above arylene group alone or as a combination of the above arylene group with a group containing a carbon-carbon triple bond and/or a group containing a carbon-carbon double bond.

Examples of the organic group containing the above arylene group include an organic group containing a fluorene structure or an organic group containing a biphenylene structure.

The unit structure of the polymer used in the present invention can be exemplified as follows.

Formula (3-1)

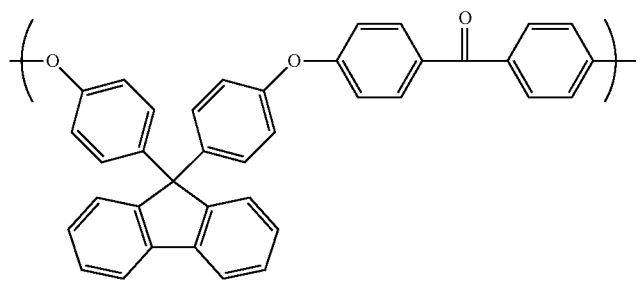

-continued

Formula (3-2)

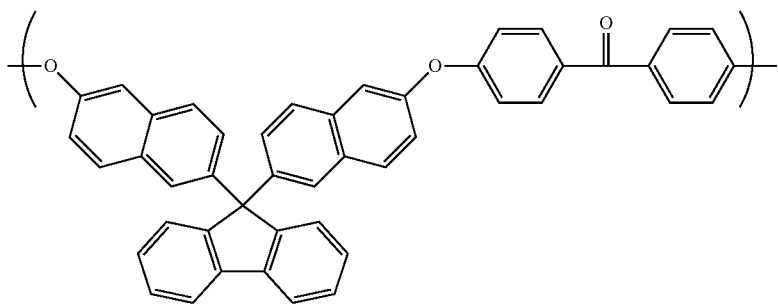

Formula (3-3)

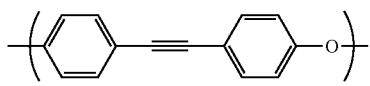

Formula (3-4)

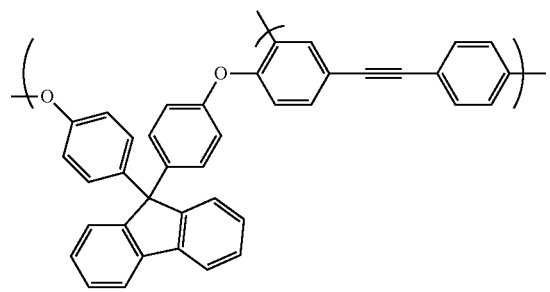

Formula (3-5)

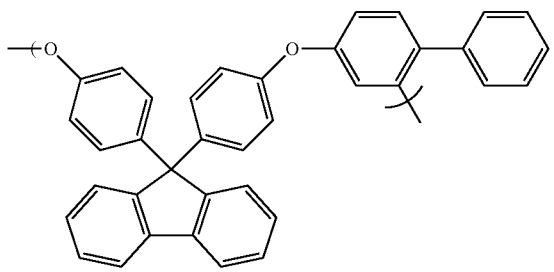

Formula (3-6)

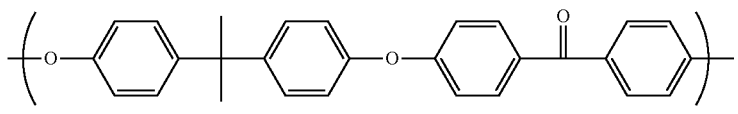

Formula (3-7)

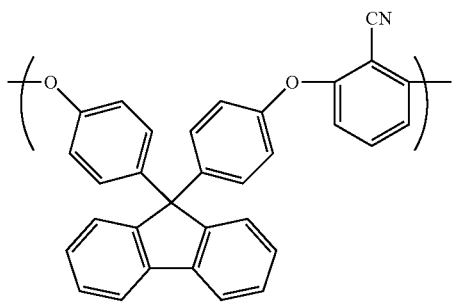

Formula (3-8)

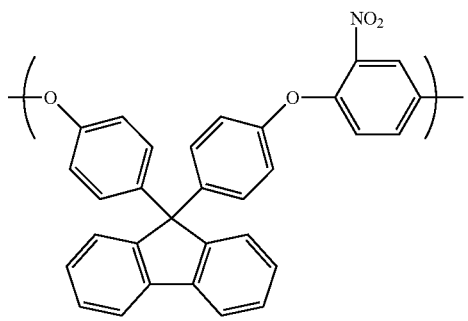

The resist underlayer film forming composition of the present invention may contain a crosslinking agent component. Examples of the crosslinking agent include a melamine-based crosslinking agent, a substituted urea-based crosslinking agent, and a polymer thereof-based crosslinking agent. The crosslinking agent is preferably a crosslinking agent having at least two crosslinkage forming substituents and examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensation product of these compounds can also be used.

As the crosslinking agent, a crosslinking agent having high heat resistance can be used. As the crosslinking agent having high heat resistance, a compound containing, in the molecule thereof, a crosslinkage forming substituent having an aromatic ring (such as a benzene ring and a naphthalene ring) can be preferably used.

Examples of such a compound include a compound having a partial structure of Formula (4) below, a polymer or an oligomer having a repeating unit of Formula (5) below.

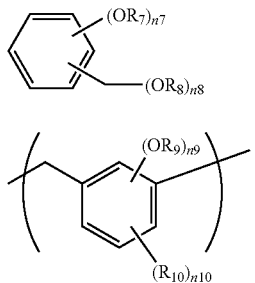

Formula (4)

Formula (5)

In Formula (4), $R_7$ and $R_8$ are individually a hydrogen atom, a $C_{1-10}$ alkyl group, or a $C_{6-20}$ aryl group; and n7 is an integer of 1 to 4, n8 is an integer of 1 to (5-n7) and n7+n8 is an integer of 2 to 5. In Formula (5), $R_9$ is a hydrogen atom or a $C_{1-10}$ alkyl group; $R_{10}$ is a $C_{1-10}$ alkyl group; and n9 is an integer of 1 to 4, n10 is an integer of 0 to (4-n9) and n9+n10 is an integer of 1 to 4. The polymer and the oligomer can be used in a range of the number of repeating unit structures of 2 to 100 or 2 to 50. Examples of the alkyl group and the aryl group include individually the above examples.

The compound of Formula (4), the polymer, oligomer thereof and the compound of Formula (5), the polymer and oligomer thereof are exemplified as follows.

Formula (6-1)

Formula (6-2)

Formula (6-3)

Formula (6-4)

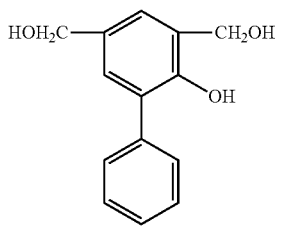

Formula (6-5)

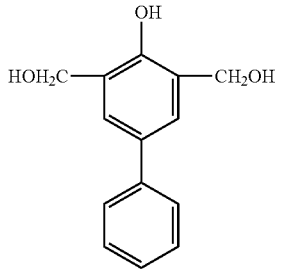

Formula (6-6)

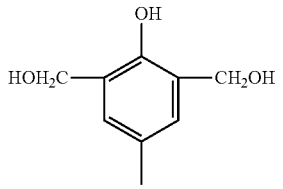

Formula (6-7)

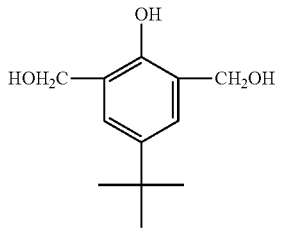

Formula (6-8)

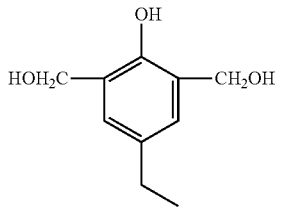

Formula (6-9)

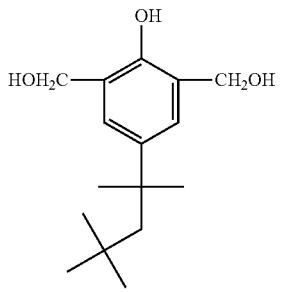

Formula (6-10)

Formula (6-11)
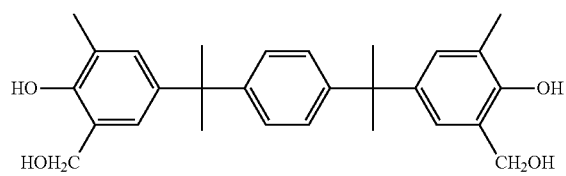
Formula (6-12)
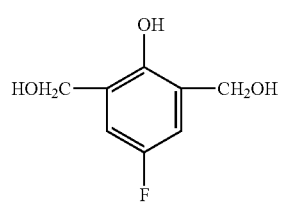
Formula (6-13)
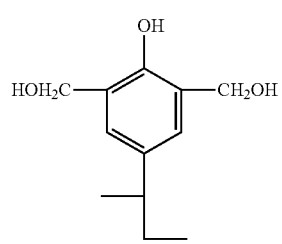
Formula (6-14)
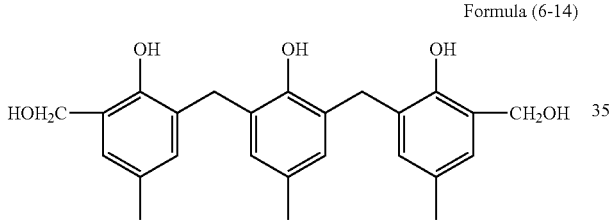
Formula (6-15)
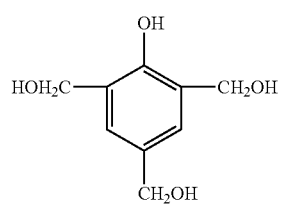
Formula (6-16)
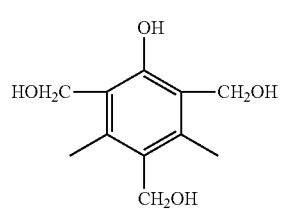
Formula (6-17)
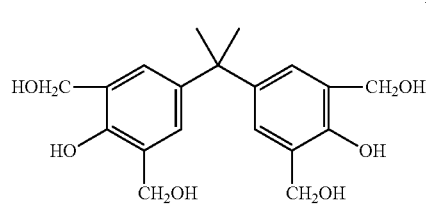
Formula (6-18)
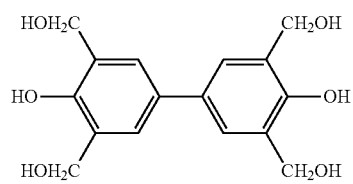
Formula (6-19)
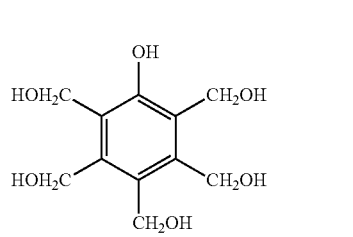
Formula (6-20)
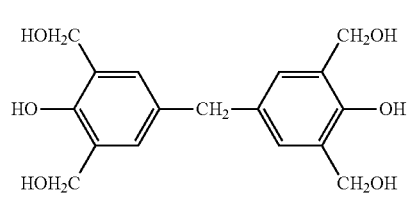
Formula (6-21)
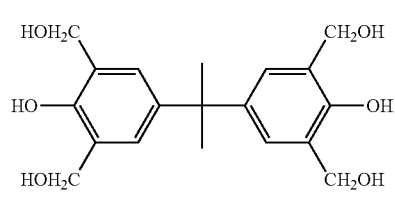
Formula (6-22)
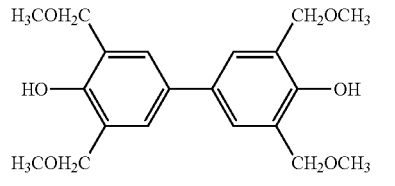
Formula (6-23)
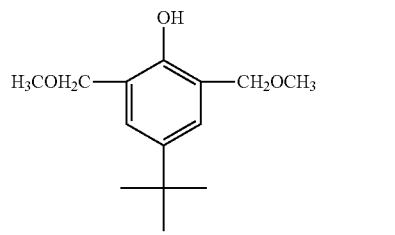
Formula (6-24)
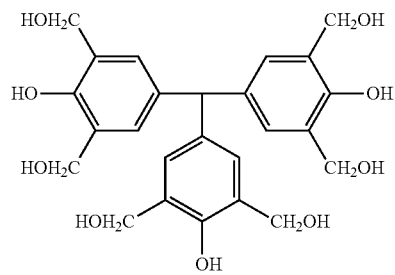

-continued

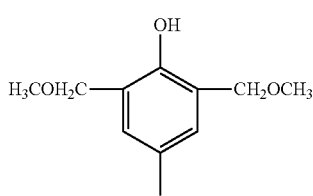

Formula (6-25)

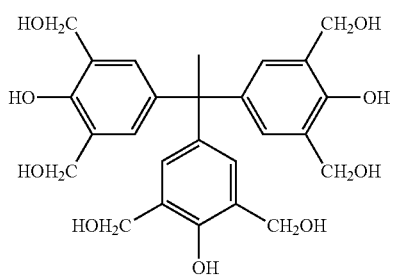

Formula (6-26)

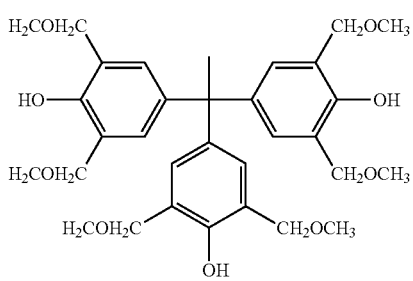

Formula (6-27)

The above compounds are commercially available as the products of Asahi Organic Chemicals Industry Co., Ltd. and Honshu Chemical Industry Co., Ltd. For example, among the above crosslinking agents, a compound of Formula (6-21) is commercially available from Asahi Organic Chemicals Industry Co., Ltd. under a trade name: TM-BIP-A.

Although the additive amount of the crosslinking agent is varied depending on the used coating solvent, the used ground substrate, the required viscosity of solution, the required film shape, and the like, it is 0.001 to 80% by mass, preferably 0.01 to 50% by mass, further preferably 0.05 to 40% by mass, based on the total mass of the solid content. Although the crosslinking agent may effect a crosslinking reaction by self-condensation, when a crosslinkable substituent exists in the above polymer of the present invention, the crosslinking agent can effect the crosslinking reaction with such a crosslinkable substituent.

In the present invention, as a catalyst for accelerating the crosslinking reaction, an acidic compound such as p-toluenesulfonic acid, trifluoromethanesulfonic acid, pyridinium-p-toluenesulfonic acid, salicylic acid, sulfosalicylic acid, citric acid, benzoic acid, hydroxybenzoic acid, and naphthalenecarboxylic acid or/and a thermoacid generator such as 2,4,4,6-tetrabromocyclohexadienone, benzoin tosylate, 2-nitrobenzyl tosylate, and organic sulfonic acid alkyl esters can be blended. The blending amount thereof is 0.0001 to 20% by mass, preferably 0.0005 to 10% by mass, more preferably 0.01 to 3% by mass, based on the total mass of the solid content.

In the coating-type underlayer film forming composition for lithography of the present invention, for conforming the acidity of the underlayer film forming composition to the acidity of the photoresist applied as an upper layer of the underlayer film thereon in a lithography process, a photoacid generator can be blended. Preferred examples of the photoacid generator include: onium salt photoacid generators such as bis(4-tert-butylphenyl)iodonium trifluoromethanesulfonate and triphenylsulfonium trifluoromethanesulfonate; halogen-containing compound photoacid generators such as phenyl-bis(trichloromethyl)-s-triazine; and sulfonic acid-based photoacid generators such as benzoin tosylate and N-hydroxysuccinimide trifluoromethanesulfonate. The content of the photoacid generator is 0.2 to 10% by mass, preferably 0.4 to 5% by mass, based on the total mass of the solid content.

In the resist underlayer film material for lithography of the present invention, besides the above components, if necessary, an additional light absorber, a rheology controlling agent, an adhesion assistant, a surfactant, and the like can be added.

As the additional light absorber, there can be preferably used, for example, commercially available light absorbers described in "Technology and market of industrial dyestuff" (published by CMC Publishing CO., Ltd.) or "Dye handbook" (published by the Society of Synthetic Organic Chemistry, Japan) such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorber is blended usually in a content of 10% by mass or less, preferably 5% by mass or less, based on the total mass of the solid content of the resist underlayer film material for lithography.

The rheology controlling agent is added for the purpose of mainly enhancing the fluidity of the resist underlayer film forming composition, particularly enhancing the homogeneity of the film thickness of the resist underlayer film or enhancing the filling property of the resist underlayer film forming composition into the inside of a hole, in a baking process. Specific examples of the rheology controlling agent include: phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. These rheology controlling agents are blended in a content of usually less than 30% by mass, based on the total mass of the solid content of the resist underlayer film material for lithography.

The adhesion assistant is added for the purpose of mainly enhancing the adhesion of the resist underlayer film forming composition and the substrate or the resist, particularly preventing the resist from being peeled during development. Specific examples of the adhesion assistant include: chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethlsilyl)urea, dimethyltrimethylsilylamine, and trimethylsilylimidazol;

silanes such as vinyltrichlorosilane, γ-chloropropyltrimethoxy silane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine; and urea or thiourea compounds such as 1,1-dimethylurea and 1,3-dimethylurea. These adhesion assistants are blended in a content of usually less than 5% by mass, preferably less than 2% by mass, based on the total mass of the solid content of the resist underlayer film material for lithography.

In the resist underlayer film material for lithography of the present invention, for causing no pinhole and no striation and further, enhancing the applicability relative to a surface unevenness, a surfactant can be blended. Examples of the surfactant include: nonionic surfactants, for example polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, for example, EFTOP EF301, EF303, and EF352 (trade names, manufactured by Tohkem Products Co., Ltd.), MEGAFAC F171, F173, and R-30 (trade names, manufactured by DIC Corporation), Fluorad FC430 and FC431 (trade names, manufactured by Sumitomo 3M Limited), Asahi Guard AG710 and Surfron S-382, SC101, SC102, SC103, SC104, SC105, and SC106 (trade names, manufactured by Asahi Glass Co., Ltd.); and Organosiloxane polymer KP341 (manufactured by Shin-Etsu Chemical Co., Ltd.). The blending amount of the surfactant is usually 2.0% by mass or less, preferably 1.0% by mass or less, based on the total mass of the solid content of the resist underlayer film material for lithography of the present invention. These surfactants may be used individually or in combination of two or more of them.

In the present invention, examples of the solvent for dissolving the polymer, the crosslinking agent component, the crosslinking catalyst, and the like include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used individually or in combination of two or more of them.

Furthermore, to the solvent, a high boiling point-solvent such as propylene glycol monobutyl ether and propylene glycol monobutyl ether acetate can be mixed to be used. Among these solvents, propylene glycol monomethyl ether, propylene glycol monomethyl ether acetate, ethyl lactate, butyl lactate, and cyclohexanone are preferred for enhancing the leveling property.

As the resist used in the present invention, a photoresist, an electron beam resist, and the like can be used.

As the photoresist applied and formed on the resist underlayer film for lithography in the present invention, both of a negative-type photoresist and a positive-type photoresist can be used. Examples of the photoresist include: a positive-type photoresist containing a novolac resin and 1,2-naphthoquinonediazide sulfonic acid ester; a chemical amplification type photoresist containing a binder having a group elevating alkali dissolving rate by being decomposed by an acid, and a photoacid generator; a chemical amplification type photoresist containing an alkali-soluble binder, a low molecule compound elevating alkali dissolving rate of a photoresist by being decomposed by an acid, and a photoacid generator; a chemical amplification type photoresist containing a binder having a group elevating alkali dissolving rate by being decomposed by an acid, a low molecule compound elevating alkali dissolving rate of a photoresist by being decomposed by an acid, and a photoacid generator; and a photoresist having, in the skeleton thereof, an Si atom. Specific examples thereof include trade name: APEX-E manufactured by Rohm and Haas Company.

Examples of the electron beam resist applied and formed on the resist underlayer film for lithography in the present invention include: a composition containing a resin containing a Si—Si bond in the backbone thereof and containing an aromatic ring at a terminal thereof, and an acid generator generating an acid by being irradiated with an electron beam; or a composition containing poly(p-hydroxystyrene) in which a hydroxy group is substituted with an organic group containing N-carboxyamine and an acid generator generating an acid by being irradiated with an electron beam. In the later electron beam resist composition, an acid generated from the acid generator by electron beam irradiation is reacted with an N-carboxyaminoxy group in a side chain of the polymer and the side chain of the polymer is decomposed to a hydroxy group to exhibit alkali solubility and to be dissolved in an alkaline developer, so that a resist pattern is formed. Examples of the acid generator generating an acid by the electron beam irradiation include: a halogenated organic compound such as 1,1-bis[p-chlorophenyl]-2,2,2-trichloroethane, 1,1-bis[p-methoxyphenyl]-2,2,2-trichloroethane, 1,1-bis[p-chlorophenyl]-2,2,2-dichloroethane, and 2-chloro-6-(trichloromethyl)pyridine; an onium salt such as a triphenylsulfonium salt and a diphenyliodonium salt; and a sulfonic acid ester such as nitrobenzyl tosylate and dinitrobenzyl tosylate.

Examples of the developer for the resist having the resist underlayer film formed using the resist underlayer film material for lithography of the present invention include aqueous solutions of alkalis such as: inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. Furthermore, to the aqueous solution of the above alkalis, an appropriate amount of alcohols such as isopropyl alcohol or a nonion-based or the like surfactant may be added to be used. Among them, a preferred developer is a quaternary ammonium salt and further preferred developers are tetramethylammonium hydroxide and choline.

Next, the forming method of the resist pattern of the present invention is described. Onto a substrate (for example, a transparent substrate such as a glass substrate and an ITO substrate which are coated with silicon/silicon dioxide) used for the production of a precise integrated circuit element, a resist underlayer film forming composition is applied by an appropriate coating method such as spinner and coater, and is baked to be cured to produce a coating-type underlayer film. The resist underlayer film has a film thickness of preferably 0.01 to 3.0 μm. The conditions for baking after coating are at 80 to 350° C. and for 0.5 to 120 minutes. Then, onto the resist underlayer film, either directly or if necessary, through a film formed with one layer or several layers of a coating material on the coating-type underlayer film, the resist is applied and the resist is irradiated with light or an electron beam through a predetermined mask. Then, by developing, rinsing, and drying the resist, an advantageous resist pattern can be obtained. If necessary, heating after irradiation with light or an electron beam (PEB: Post Exposure Bake) can be performed. Then, by removing the resist underlayer film in a part at which the resist is removed by development in the above process by dry etching, a desired pattern can be formed on the substrate.

The exposure light for the photoresist is a chemical ray such as a near ultraviolet ray, a far ultraviolet ray, or an extreme ultraviolet ray (for example, EUV) and as the exposure light, light of a wavelength of 248 nm (KrF laser light), 193 nm (ArF laser light), or 157 nm ($F_2$ laser light) is used. The light irradiating method is not particularly limited to be used as long as the method is a method capable of generating an acid from the photoacid generator and the light irradiating method is performed with an exposure dose of 1 to 2,000 mJ/cm$^2$, 10 to 1,500 mJ/cm$^2$, or 50 to 1,000 mJ/cm$^2$.

The electron beam irradiation for the electron beam resist can be performed, for example, using an electron beam irradiating apparatus.

In the present invention, a semiconductor device can be produced through a process of forming a resist underlayer film with a resist underlayer film forming composition on a semiconductor substrate, a process of forming a resist film on the resist underlayer film, a process of forming a resist pattern by light irradiation or electron beam irradiation and development, a process of etching the resist underlayer film according to the resist pattern, and a process of processing the semiconductor substrate according to the patterned resist underlayer film.

Progress in refinement of the resist pattern will cause a problem of the resolution or collapse of a resist pattern after development; therefore, thinning of the resist will be required. In this sense, it is difficult to secure a film thickness of the resist pattern sufficient for processing the substrate, which requires a process for imparting a function as a mask for processing the substrate not only to the resist pattern, but also to the resist underlayer film provided between the resist and the semiconductor substrate to be processed. As a resist underlayer film for such a process, there has started to be required a resist underlayer film for lithography having a selection ratio of a dry etching rate close to that of the resist, a resist underlayer film for lithography having a selection ratio of a dry etching rate smaller than that of the resist, and a resist underlayer film for lithography having a selection ratio of a dry etching rate smaller than that of the semiconductor substrate, as a resist underlayer film, unlike a conventional resist underlayer film having high etching rate property. In addition, to such a resist underlayer film, reflection preventing ability can also be imparted, so that such a resist underlayer film can provide a function of a conventional anti-reflective coating in combination with other advantageous properties.

For obtaining a fine resist pattern, there has started to be used also a process of making the resist pattern and the resist underlayer film thinner than the pattern width during development of the resist, during dry etching of the resist underlayer film. As a resist underlayer film for such a process, there has started to be required a resist underlayer film having a selection ratio of a dry etching rate close to that of the resist, unlike a conventional high etching rate anti-reflective coating. To such a resist underlayer film, a reflection preventing ability can be imparted, so that such a resist underlayer film can provide a function of a conventional anti-reflective coating in combination with other advantageous properties.

In the present invention, the resist underlayer film of the present invention is formed on a substrate, and then on the resist underlayer film, either directly or if necessary, through a film formed with one layer or several layers of coating material on the resist underlayer film, the resist can be applied. This makes it possible to process the substrate by selecting an appropriate etching gas even when the pattern width of the resist is small and the resist is coated in a small thickness for preventing a pattern collapse.

That is, through: a process of forming the resist underlayer film with a resist underlayer film forming composition on a semiconductor substrate; a process of forming a hardmask with a coating material containing a silicon component or the like on the resist underlayer film; a process of forming a resist film further on the hardmask; a process of forming a resist pattern by irradiation with light or an electron beam and development; a process of etching the hardmask according to the resist pattern; a process of etching the resist underlayer film according to the patterned hardmask; and a process of processing the semiconductor substrate according to the patterned resist underlayer film, a semiconductor device can be produced.

In the resist underlayer film forming composition for lithography of the present invention, when the effect thereof as an anti-reflective coating is considered, a light absorbing moiety is incorporated into the skeleton, so that there is no substance diffused into the photoresist during heating and drying of the composition. Furthermore the light absorbing moiety has satisfactorily high light absorbing performance; therefore, the composition has high effect of preventing reflected light.

The resist underlayer film forming composition for lithography of the present invention has high thermal stability, can prevent contamination of an upper layer film of the resist underlayer film by a decomposed substance during baking the resist underlayer film, and can allow leeway in the temperature margin for the baking process.

Furthermore, the resist underlayer film material for lithography of the present invention can be used, depending on the process condition, as a film having a function of preventing reflection of light and further, a function of preventing an interaction between the substrate and the photoresist or a function of preventing an adverse action of a material used for the photoresist or a substance generated during light exposure of the photoresist against the substrate.

EXAMPLE

Synthesis Example 1

Into a flask equipped with a stirrer, a reflux apparatus, and a thermometer, 28.04 g of 9,9-bis(4-hydroxyphenyl)fluorene, 13.97 g of 4,4'-difluorobenzophenone, 12.32 g of potassium carbonate, and 162.56 g of N-methyl-2-pyrrolidinone were charged. Then, the inside of the flask was purged with nitrogen and the flask was heated until the inner temperature thereof became 140° C., followed by effecting the reaction for about 24 hours. The synthesized polymer was cooled down to room temperature and the reaction mixture was filtered for removing a precipitate to recover the resultant reaction filtrate. The reaction filtrate was mixed with about 10 mL of a mixture of N-methyl-2-pyrrolidinone and 2 mol/L hydrochloric acid in a volume ratio of 90:10. Then, the resultant reaction filtrate was charged into methanol to perform reprecipitation purification of the reaction filtrate.

Furthermore, the resultant precipitate was washed with water and methanol and was vacuum-dried at 85° C. for about one day to obtain a polyether used in the present invention. The obtained polymer corresponded to Formula (3-1). The obtained polymer having an ether structure was subjected to GPC analysis and the polymer had a weight average molecular weight of 6,900 and a polydispersity Mw/Mn of 1.83 in terms of standard polystyrene.

Synthesis Example 2

Into a 100 mL three-neck flask, 6.76 g of 6,6'-(9H-fluorene-9,9-diyl)dinaphthalene-2-ole, 3.27 g of 4,4'-difluorobenzophenone, 42.72 g of N-methyl-2-pyrrolidinone, and 2.49 g of potassium carbonate were charged. Then, the inside of the flask was purged with nitrogen and the flask was heated to 170° C., followed by effecting the reaction for about 24 hours. Then, to the resultant reaction mixture, 0.65 g of 1-naphthol dissolved in 5.84 g of N-methyl-2-pyrrolidinone was added and the resultant reaction mixture was stirred further for 2 hours. After the completion of the reaction, the reaction mixture was diluted with 20 g of N-methyl-2-pyrrolidinone and a precipitate was removed by filtration. The recovered filtrate was dropped into a mixed solution of methanol/water/toluene (350 g/50 g/30 g) to perform reprecipitation. The resultant precipitate was filtered under reduced pressure and the filtered substance was dried under reduced pressure at 85° C. over one night. Then, 7.92 g of a polyether was obtained as a light skin color powder. The obtained polymer corresponded to Formula (3-2). By GPC, the obtained polymer had a weight average molecular weight Mw of 9,400 and a polydispersity Mw/Mn of 2.21 that were measured in terms of polystyrene.

Synthesis Example 3

Into a 100 mL three-neck flask, 5.09 g of 4-(4-fluorophenylethynyl)phenol, 45.84 g of N-methyl-2-pyrrolidinone, and 3.65 g of potassium carbonate were charged. Then, the inside of the flask was purged with nitrogen and the flask was heated to 170° C., followed by effecting the reaction for about 24 hours. After the completion of the reaction, a precipitate was removed by filtration. The recovered filtrate was dropped into 400 g of methanol to perform reprecipitation. The resultant precipitate was filtered under reduced pressure and the filtered substance was dried under reduced pressure at 85° C. over one night. Then, 5.12 g of a polyether was obtained as a green color powder. The obtained polymer corresponded to Formula (3-3). By GPC, the obtained polymer had a weight average molecular weight Mw of 51,000 and a polydispersity Mw/Mn of 5.47 that were measured in terms of polystyrene.

Synthesis Example 4

Into a 100 mL three-neck flask, 2.76 g of p-(3,4-difluorophenylethynyl)phenol, 2.10 g of 9,9-bis(4-hydroxyphenyl)fluorene, 27.57 g of N-methyl-2-pyrrolidinone, and 3.48 g of potassium carbonate were charged. Then, the inside of the flask was purged with nitrogen and the flask was heated to 150° C., followed by effecting the reaction for about 6 hours. After the completion of the reaction, a precipitate was removed by filtration. The recovered filtrate was dropped into a mixed solution of methanol/water (500 g/250 g) to perform reprecipitation. The resultant precipitate was filtered under reduced pressure and the filtered substance was dried under reduced pressure at 85° C. over one night. Then, 3.70 g of a polyether was obtained as a skin color powder. The obtained polymer corresponded to Formula (3-4). By GPC, the obtained polymer had a weight average molecular weight Mw of 20,000 and a polydispersity Mw/Mn of 4.49 that were measured in terms of polystyrene.

Synthesis Example 5

Into a 100 mL three-neck flask, 8.06 g of 9,9-bis(4-hydroxyphenyl)fluorene, 4.81 g of 2,4-difluorobiphenyl, 32.35 g of N-methyl-2-pyrrolidinone, and 6.99 g of potassium carbonate were charged. Then, the inside of the flask was purged with nitrogen and the flask was heated to 170° C., followed by effecting the reaction for about 24 hours. Then, to the resultant reaction mixture, 0.99 g of 1-naphthol dissolved in 8.95 g of N-methyl-2-pyrrolidinone was added and the resultant reaction mixture was stirred further for 2 hours. After the completion of the reaction, a precipitate was removed by filtration. The recovered filtrate was dropped into a mixed solution of methanol/water (160 g/40 g) to perform reprecipitation. The resultant precipitate was filtered under reduced pressure and the filtered substance was dried under reduced pressure at 85° C. over one night. Then, 5.90 g of a polyether was obtained as a skin color powder. The obtained polymer corresponded to Formula (3-5). By GPC, the obtained polymer had a weight average molecular weight Mw of 1,000 and a polydispersity Mw/Mn of 1.21 that were measured in terms of polystyrene.

Synthesis Example 6

As one example of synthesis of a polymer having a polyether structure, into a flask equipped with a stirrer, a reflux apparatus, and a thermometer, 32.02 g of 2,2-bis(4-hydroxyphenyl)propane, 25.97 g of 4,4'-difluorobenzophenone, 21.30 g of potassium carbonate, and 237.76 g of N-methyl-2-pyrrolidinone were charged. Then, the inside of the flask was purged with nitrogen and the flask was heated until the inner temperature thereof became 140° C., followed by effecting the reaction for about 24 hours. The synthesized polymer was cooled down to room temperature and the reaction mixture was filtered for removing a precipitate to recover the resultant reaction filtrate. The reaction filtrate was mixed with about 10 mL of a mixture of N-methyl-2-pyrrolidinone and 2 mol/L hydrochloric acid in a volume ratio of 90:10. Then, the resultant reaction filtrate was charged into a mixed solution of methanol/water (volume ratio=90/10) to perform reprecipitation purification of the reaction filtrate.

Furthermore, the resultant precipitate was washed with water and methanol and was vacuum-dried at 85° C. for about one day to obtain a polyether used in the present invention. The obtained polymer corresponded to Formula (3-6). The obtained polymer having an ether structure was subjected to GPC analysis and the polymer had a weight average molecular weight of 7,600 and a polydispersity Mw/Mn of 1.96 in terms of standard polystyrene.

Synthesis Example 7

As one example of synthesis of a polymer having a polyether structure, into a flask equipped with a stirrer, a reflux apparatus, and a thermometer, 17.52 g of 9,9-bis(4-hydroxyphenyl)fluorene, 6.22 g of 2,6-difluorobenzonitrile, 7.64 g of potassium carbonate, and 94.63 g of N-methyl-2-pyrrolidinone were charged. Then, the inside of the flask was purged with nitrogen and the flask was heated until the inner temperature thereof became 140° C., followed by effecting the reaction for about 24 hours. The synthesized polymer was cooled down to room temperature and the reaction mixture was filtered for removing a precipitate to recover the resultant reaction filtrate. The reaction filtrate was mixed with about 10 mL of a mixture of N-methyl-2-pyrrolidinone and 2 mol/L hydrochloric acid in a volume ratio of 90:10. Then, the resultant reaction filtrate was charged into a methanol solution to perform reprecipitation purification of the reaction filtrate.

Furthermore, the resultant precipitate was washed with water and methanol and was vacuum-dried at 85° C. for about one day to obtain 19.72 g of a polyether used in the present invention. The obtained polymer corresponded to Formula (3-7). The obtained polymer having an ether structure was subjected to GPC analysis and the polymer had a weight average molecular weight of 15,000 and a polydispersity Mw/Mn of 2.65 in terms of standard polystyrene.

Synthesis Example 8

As one example of synthesis of a polymer having a polyether structure, into a flask equipped with a stirrer, a reflux apparatus, and a thermometer, 26.29 g of 9,9-bis(4-hydroxyphenyl)fluorene, 11.35 g of 2,5-difluoronitrobenzene, 11.40 g of potassium carbonate, and 147.07 g of N-methyl-2-pyrrolidinone were charged. Then, the inside of the flask was purged with nitrogen and the flask was heated until the inner temperature thereof became 140° C., followed by effecting the reaction for about 24 hours. The synthesized polymer was cooled down to room temperature and the reaction mixture was filtered for removing a precipitate to recover the resultant reaction filtrate. The reaction filtrate was mixed with about 10 mL of a mixture of N-methyl-2-pyrrolidinone and 2 mol/L hydrochloric acid in a volume ratio of 90:10. Then, the resultant reaction filtrate was charged into a methanol solution to perform reprecipitation purification of the reaction filtrate.

Furthermore, the resultant precipitate was washed with water and methanol and was vacuum-dried at 85° C. for about one day to obtain 28.39 g of a polyether used in the present invention. The obtained polymer corresponded to Formula (3-8). The obtained polymer having an ether structure was subjected to GPC analysis and the polymer had a weight average molecular weight of 4,400 and a polydispersity Mw/Mn of 1.70 in terms of standard polystyrene.

Example 1

3 g of the resin obtained in Synthesis Example 1 was dissolved in 12 g of cyclohexanone to prepare a solution of a resist underlayer film forming composition used for a lithography process by a multilayer film.

Example 2

3 g of the resin obtained in Synthesis Example 2 was dissolved in 12 g of cyclohexanone to prepare a solution of a resist underlayer film forming composition used for a lithography process by a multilayer film.

Example 3

3 g of the resin obtained in Synthesis Example 3 was dissolved in 12 g of cyclohexanone to prepare a solution of a resist underlayer film forming composition used for a lithography process by a multilayer film.

Example 4

3 g of the resin obtained in Synthesis Example 4 was dissolved in 12 g of cyclohexanone to prepare a solution of a resist underlayer film forming composition used for a lithography process by a multilayer film.

Example 5

3 g of the polymer obtained in Synthesis Example 5 was dissolved in 12 g of cyclohexanone to prepare a solution of a resist underlayer film forming composition used for a lithography process by a multilayer film.

Example 6

3 g of the polymer obtained in Synthesis Example 6 was dissolved in 12 g of cyclohexanone to prepare a solution of a resist underlayer film forming composition used for a lithography process by a multilayer film.

Example 7

To 20 g of the resin obtained in Synthesis Example 1, 3.0 g of a crosslinking agent (manufactured by Japan Cytec Industries, Inc., containing as a component, tetramethoxymethyl glycoluril, Formula (7-1)) and 0.30 g of p-toluenesulfonic acid as a catalyst were mixed and the resultant mixture was dissolved in 88 g of cyclohexanone to prepare a solution of a resist underlayer film forming composition used for a lithography process by a multilayer film.

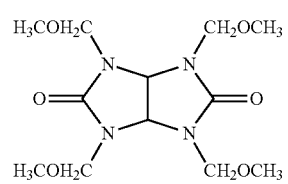

Formula (7-1)

Example 8

To 20 g of the resin obtained in Synthesis Example 2, 3.0 g of a crosslinking agent (manufactured by Japan Cytec Industries, Inc., containing as a component, tetramethoxymethyl glycoluril, Formula (7-1)), 0.30 g of pyridinium p-toluenesulfonate as a catalyst, and 0.06 g of MEGAFAC R-30 as a surfactant were mixed and the resultant mixture was dissolved in 88 g of cyclohexanone to prepare a solution of a resist underlayer film forming composition used for a lithography process by a multilayer film.

Comparative Example 1

A solution of a cresol novolac resin (commercial product, weight average molecular weight: 4,000) was used.

Example 9

3 g of the polymer obtained in Synthesis Example 7 was dissolved in 12 g of cyclohexanone to prepare a solution of a resist underlayer film forming composition used for a lithography process by a multilayer film.

Example 10

3 g of the polymer obtained in Synthesis Example 8 was dissolved in 12 g of cyclohexanone to prepare a solution of a resist underlayer film forming composition used for a lithography process by a multilayer film.

Comparative Example 2

3 g of polyethylene glycol (manufactured by Tokyo Chemical Industry Co., Ltd.) having a molecular weight of 1,000 was dissolved in 12 g of propylene glycol monoethyl ether acetate to prepare a solution.

(Measurement of Optical Parameters)

The resist underlayer film solutions prepared in Examples 1 to 10 and Comparative Examples 1 and 2 were individually applied onto a silicon wafer with a spin coater. The solution was baked on a hot plate at 240° C. for 1 minute (in Comparative Example 1: at 205° C. for 1 minute, in Comparative Example 2: at 160° C. for 1 minute) or at 400° C. for 2 minutes to form a resist underlayer film (film thickness: 0.05 μm). The refractive index (n value) at a wavelength of 193 nm and optical absorptivity (k value, also called attenuation coefficient) of these resist underlayer films were measured using a spectroscopic ellipsometer. The results of the measurements are listed in Table 1.

TABLE 1

| Refractive index n and optical absorptivity k | | | |
|---|---|---|---|
| | | n (193 nm) | k (193 nm) |
| Example 1 | Film baked at 240° C. | 1.48 | 0.77 |
| | Film baked at 400° C. | 1.48 | 0.75 |
| Example 2 | Film baked at 240° C. | 1.39 | 0.49 |
| | Film baked at 400° C. | 1.39 | 0.51 |
| Example 3 | Film baked at 240° C. | 1.55 | 0.59 |
| | Film baked at 400° C. | 1.54 | 0.63 |
| Example 4 | Film baked at 240° C. | 1.49 | 0.64 |
| | Film baked at 400° C. | 1.63 | 0.73 |
| Example 5 | Film baked at 240° C. | 1.47 | 0.77 |
| | Film baked at 400° C. | 1.46 | 0.73 |
| Example 6 | Film baked at 240° C. | 1.58 | 0.81 |
| | Film baked at 400° C. | 1.57 | 0.79 |

TABLE 1-continued

| Refractive index n and optical absorptivity k | | | |
|---|---|---|---|
| | | n (193 nm) | k (193 nm) |
| Example 7 | Film baked at 240° C. | 1.49 | 0.72 |
| | Film baked at 400° C. | 1.47 | 0.73 |
| Example 8 | Film baked at 240° C. | 1.43 | 0.49 |
| | Film baked at 400° C. | 1.40 | 0.51 |
| Example 9 | Film baked at 240° C. | 1.43 | 0.71 |
| | Film baked at 400° C. | 1.41 | 0.70 |
| Example 10 | Film baked at 240° C. | 1.47 | 0.75 |
| | Film baked at 400° C. | 1.46 | 0.74 |
| Comparative Example 1 | Film baked at 205° C. | 1.53 | 0.42 |
| | Film baked at 400° C. | Unmeasurable | Unmeasurable |
| Comparative Example 2 | Film baked at 160° C. | 1.68 | 0.00 |
| | Film baked at 400° C. | Unmeasurable | Unmeasurable |

(Dissolution Test into Photoresist Solvents)

The solutions of the resist underlayer film forming composition prepared in Examples 1 to 10 were individually applied onto a silicon wafer with a spin coater. The solution was baked on a hot plate at 240° C. for 1 minute (in Comparative Example 1: at 205° C. for 1 minute, in Comparative Example 2: at 160° C. for 1 minute) or at 400° C. for 2 minutes to form a resist underlayer film (film thickness: 0.20 μm). The resist underlayer film was subjected to an immersion test in a solvent used for the resist such as ethyl lactate, propylene glycol monomethyl ether, propylene glycol monomethyl ether acetate, and cyclohexanone.

Although the films prepared by baking the solutions of Examples 1 to 6 and Examples 9 and 10 at 240° C. for 1 minute were dissolved in these solvents, it was confirmed that the films prepared by baking the solutions of these Examples at 400° C. for 2 minutes were insoluble in these solvents. In addition, it was also confirmed that not only the films prepared by baking the solutions of Examples 7 and 8 at 400° C. for 2 minutes, but also the films prepared by baking the solutions of Examples 7 and 8 at 240° C. for 1 minute were insoluble in these solvents.

(Measurement of Dry Etching Rates)

The etcher and the etching gas used for the measurement of dry etching rates were as follows.

RIE-10NR (manufactured by Samco, Inc.): $CF_4$

The solutions of the resist underlayer film forming composition prepared in Examples 1 to 10 and Comparative Examples 1 and 2 were individually applied onto a silicon wafer with a spin coater. The solution was baked on a hot plate at 240° C. for 1 minute (in Comparative Example 1: at 205° C. for 1 minute, in Comparative Example 2: at 160° C. for 1 minute) or at 400° C. for 2 minutes to form a resist underlayer film (film thickness: 0.20 μm). Using $CF_4$ gas as an etching gas, dry etching rates of the resist underlayer films were measured.

In the same manner, a phenol novolac resin solution was applied onto a silicon wafer with a spin coater to form a coating film. Using $CF_4$ gas as an etching gas, the dry etching rate of the coating film was measured and was compared with the dry etching rate of the resist underlayer films of Examples 1 to 10 and Comparative Examples 1 and 2. The results thereof are listed in Table 2. In Examples 1 to 10, the dry etching rate ratio is a dry etching rate ratio (1) of (resist underlayer film baked at 240° C.)/(phenol novolac resin baked at 240° C.) and a dry etching rate ratio (2) of (resist underlayer film baked at 400° C.)/(phenol novolac resin baked at 240° C.).

In Comparative Example 1, the dry etching rate ratio is a dry etching rate ratio (1) of (resist underlayer film baked at 205° C.)/(phenol novolac resin baked at 240° C.) and a dry etching rate ratio (2) of (resist underlayer film baked at 400° C.)/(phenol novolac resin baked at 240° C.).

In Comparative Example 2, the dry etching rate ratio is a dry etching rate ratio (1) of (resist underlayer film baked at 160° C.)/(phenol novolac resin baked at 240° C.) and a dry etching rate ratio (2) of (resist underlayer film baked at 400° C.)/(phenol novolac resin baked at 240° C.).

TABLE 2

| Dry etching rate ratios | | |
|---|---|---|
| Example 1 | Dry etching rate ratio (1) | 0.84 |
|  | Dry etching rate ratio (2) | 0.84 |
| Example 2 | Dry etching rate ratio (1) | 0.79 |
|  | Dry etching rate ratio (2) | 0.79 |
| Example 3 | Dry etching rate ratio (1) | 0.95 |
|  | Dry etching rate ratio (2) | 0.95 |
| Example 4 | Dry etching rate ratio (1) | 0.91 |
|  | Dry etching rate ratio (2) | 0.98 |
| Example 5 | Dry etching rate ratio (1) | 0.86 |
|  | Dry etching rate ratio (2) | 0.85 |
| Example 6 | Dry etching rate ratio (1) | 0.96 |
|  | Dry etching rate ratio (2) | 0.96 |
| Example 7 | Dry etching rate ratio (1) | 0.86 |
|  | Dry etching rate ratio (2) | 0.85 |
| Example 8 | Dry etching rate ratio (1) | 0.82 |
|  | Dry etching rate ratio (2) | 0.80 |
| Example 9 | Dry etching rate ratio (1) | 0.82 |
|  | Dry etching rate ratio (2) | 0.81 |
| Example 10 | Dry etching rate ratio (1) | 0.85 |
|  | Dry etching rate ratio (2) | 0.84 |
| Comparative Example 1 | Dry etching rate ratio (1) | 1.00 |
|  | Dry etching rate ratio (2) | Unmeasurable |
| Comparative Example 2 | Dry etching rate ratio (1) | 2.18 |
|  | Dry etching rate ratio (2) | Unmeasurable |

(Heat Resistance Test of Films)

The solutions of the resist underlayer film forming composition prepared in Examples 1 to 10 and Comparative Examples 1 and 2 were individually applied onto a silicon wafer with a spin coater. The solution was baked on a hot plate at 400° C. for 2 minutes to form a resist underlayer film (film thickness: 0.20 μm). The obtained film was heated with a rate of 10° C./min and was subjected to thermogravimetric analysis in the atmosphere to measure a temperature at which the mass of the film decreased by 5%. The results thereof are listed in Table 3.

TABLE 3

| Temperature at which mass of the film decreased by 5% | |
|---|---|
| Film baked at 400° C. for 2 minutes | |
| Example 1 | 496° C. |
| Example 2 | 500° C. |
| Example 3 | 452° C. |
| Example 4 | 369° C. |
| Example 5 | 395° C. |
| Example 6 | 481° C. |
| Example 7 | 482° C. |
| Example 8 | 472° C. |
| Example 9 | 500° C. or more |
| Example 10 | 408° C. |
| Comparative Example 1 | Unmeasurable (when baked at 400° C., the film was sublimated) |
| Comparative Example 2 | Unmeasurable (when baked at 400° C., the film was sublimated) |

III. INDUSTRIAL APPLICABILITY

The resist underlayer film material of the present invention used for a lithography process by a multilayer film can provide a resist underlayer film having a selection ratio of a dry etching rate close to or smaller than that of a photoresist and a selection ratio of a dry etching rate smaller than that of a semiconductor substrate and further, can provide an effect as an anti-reflective coating in combination with other advantageous properties unlike a conventional anti-reflective coating having high etching rate property. In addition, it became apparent that the underlayer film material of the present invention has such heat resistance that allows a hardmask to be formed on the underlayer film as an upper layer of the underlayer film by vapor deposition.

The invention claimed is:

1. A method for producing a semiconductor device, the method comprising:
    forming an underlayer film on a semiconductor substrate with a resist underlayer film forming composition comprising:
        a solvent;
        an acid or an acid generator and
        a polymer containing a unit structure of Formula (2):

$$\mathrm{\!-\!(\!O\!-\!Ar_2\!-\!O\!-\!Ar_3\!-\!T\!-\!Ar_4\!)\!-}\qquad\text{Formula (2)}$$

where:
        $Ar_2$, $Ar_3$, and $Ar_4$ are individually a $C_{6\text{-}50}$ arylene group or an organic group containing a heterocyclic group;
        at least one of $Ar_3$ and $Ar_4$ is a phenylene group; and
        T is a carbonyl group;
        wherein the resist underlayer film forming composition has a solid content of 0.1 to 70 mass % of a total mass of the composition;
    forming a resist film on the underlayer film;
    irradiating the resist film with light or an electron beam and developing the resist film so as to form a resist pattern;
    etching the underlayer film according to the resist pattern of the resist film; and
    processing the semiconductor substrate according to the patterned underlayer film.

2. The method according to claim 1, wherein $Ar_2$ contains a fluorene structure.

3. The method according to claim 1, wherein $Ar_2$ contains an arylene group and a carbon-carbon triple bond and/or a carbon-carbon double bond.

4. The method according to claim 1, wherein $Ar_2$ contains a biphenylene structure.

5. A method for producing a semiconductor device, the method comprising:
    forming an underlayer film on a semiconductor substrate with a resist underlayer film forming composition comprising:
        a solvent; and
        a polymer containing a unit structure of Formula (2):

$$\mathrm{\!-\!(\!O\!-\!Ar_2\!-\!O\!-\!Ar_3\!-\!T\!-\!Ar_4\!)\!-}\qquad\text{Formula (2)}$$

where:
        $Ar_2$, $Ar_3$, and $Ar_4$ are individually a $C_{6\text{-}50}$ arylene group or an organic group containing a heterocyclic group;
        at least one of $Ar_3$ and $Ar_4$ is a phenylene group; and
        T is a carbonyl group;
        wherein the resist underlayer film forming composition has a solid content of 0.1 to 70 mass% of a total mass of the composition;
    forming a hardmask on the underlayer film;
    forming a resist film on the hardmask;
    irradiating the resist film with light or an electron beam and developing the resist film so as to form a resist pattern;

etching the hardmask according to the resist pattern of the resist film;

etching the underlayer film according to the patterned hardmask; and processing the semiconductor substrate according to the patterned underlayer film.

6. The method according to claim 5, wherein $Ar_2$ contains a fluorene structure.

7. The method according to claim 5, wherein $Ar_2$ contains an arylene group and a carbon-carbon triple bond and/or a carbon-carbon double bond.

8. The method according to claim 5, wherein $Ar_2$ contains a biphenylene structure.

9. The method according to claim 5, wherein the resist underlayer film forming composition further comprises an acid or an acid generator.

* * * * *